United States Patent
Fan-Jiang

(10) Patent No.: US 7,019,569 B2
(45) Date of Patent: Mar. 28, 2006

(54) METHOD OF IMPLEMENTING MULTI-TRANSFER CURVE PHASE LOCK LOOP

(75) Inventor: Chao-Hsin Fan-Jiang, ZhongLi (TW)

(73) Assignee: Faraday Technology Corp., Hsin-Chu (TW)

( * ) Notice: Subject to any disclaimer, the term of this patent is extended or adjusted under 35 U.S.C. 154(b) by 41 days.

(21) Appl. No.: 10/888,878

(22) Filed: Jul. 9, 2004

(65) Prior Publication Data

US 2006/0006914 A1   Jan. 12, 2006

(51) Int. Cl.
*H03L 7/06* (2006.01)
(52) U.S. Cl. .................................. 327/147; 327/156
(58) Field of Classification Search ............... 327/147, 327/148, 156, 157, 163; 331/17, 25; 375/373, 375/375, 376
See application file for complete search history.

(56) References Cited

U.S. PATENT DOCUMENTS 6,043,717 A * 3/2000 Kurd .......................... 331/17
6,952,124 B1 * 10/2005 Pham ......................... 327/156

\* cited by examiner

*Primary Examiner*—Linh My Nguyen
(74) *Attorney, Agent, or Firm*—Winston Hsu

(57) ABSTRACT

A phase-lock loop (PLL) has an oscillator comprising a plurality of operating curves. A method for implementing a multi-transfer curve in a phase lock loop. A means of a finite state machine cooperating with a current cell, the unwanted loop gain is effectively reduced to produce a wide-ranging operating curve.

11 Claims, 4 Drawing Sheets

METHOD OF IMPLEMENTING MULTI-TRANSFER CURVE PHASE LOCK LOOP

BACKGROUND OF THE INVENTION

The present invention relates to electronic circuits, and in particular, to phase-lock loops.

In modern technologies, signals having gigahertz frequency, requiring phase-lock loops are the foundation for various applications. A phase-lock loop (PLL) is a circuit that generates a periodic output signal having a constant phase relationship with respect to a periodic input signal.

FIG. 1 shows a block diagram of a conventional charge pump-based phase-lock loop 100. Phase/frequency detector (PFD) 102 compares the phase $\theta_{Ref}$ of the input signal $F_{Ref}$ to the phase $\theta_{back}$ of the feedback signal $F_{back}$ and generates an error signal, either an up signal (when $\theta_{Ref}$ leads $\theta_{back}$) or a down signal (when $\theta_{back}$ leads $\theta_{Ref}$), where the width of the error signal pulse indicates the magnitude of the difference between $\theta_{Ref}$ and $\theta_{Back}$.

Charge pump 104 generates an amount of charge equivalent to the error signal (either up or down) from PFD 102. Depending on whether the error signal is an up signal or a down signal, the charge is either added to or subtracted from the capacitors in loop filter 106. In this description, the loop filter 106 has a relatively simple design, comprising a capacitor $C_s$ in parallel with the series combination of a resistor R and a relatively large capacitor $C_L$. As such, loop filter 106 operates as an integrator that accumulates the net charge from charge pump 104, and the architecture is also known as a charge pump-based loop filter. Other, more-sophisticated loop filters are of course also possible. The resulting loop-filter voltage $V_{LF}$ is applied to voltage-to-current converter (V2C) 108, and a corresponding current $I_{LF}$ is applied to the current control oscillator (CCO) 110. A CCO is a device that generates aperiodic output signal ($F_{osc}$ in FIG. 1), whose frequency is a function of the CCO input current ($C_{LF}$ in FIG. 1). In addition to being the output signal from PLL 100, the CCO output signal $F_{osc}$ is used to generate the feedback signal $F_{Back}$ for the closed-loop PLL circuit.

An optional feedback divider 112 is placed in the feedback path, respectively, if the frequency of the output signal $F_{osc}$ is to be either a fraction or a multiple of the frequency of the input signal $F_{Ref}$. If not, the feedback divider applies a factor of 1 to the feedback signals, respectively.

Due to the effect of the feedback path in PLL 100, the steady-state output signal $F_{osc}$, will have a fixed phase relationship with respect to the input signal $F_{Ref}$. Unless some phase offset is purposely added, the phases of the input and output signals will be synchronized with minimal offset.

FIG. 4a shows a transfer curve according to the diagram in FIG. 1, where the input voltage $V_{LF}$ induces a corresponding output oscillating signal at frequency $F_{osc}$ through the V2C and CCO. For low-noise PLL applications, it is important for CCO 108 in FIG. 1 to have a relatively low gain. This implies that the slope of the transfer curve should be relatively low, such as those shown in FIG. 4b. It is therefore desirable to design a selectable operating curve for the CCO to generate a stable oscillating loop signal.

Conventionally, each CCO is tested in the factory to characterize its set of operating curves to pre-determine which digital control input values (i.e. N=2 in FIG. 4b) are appropriate for different desired output frequencies. When a particular CCO is selected for a particular application, such as PLL 100 of FIG. 1, the appropriate operating curve is permanently burned into the device. This factory testing and hard-wiring of the CCO adds to the cost of manufacturing the PLLs. It also limits the operating frequency range of each PLL to the permanently selected operating curve.

SUMMARY OF THE INVENTION

An object of the present invention is to provide an integrated circuit having a phase-lock loop (PLL). The PLL comprises a phase/frequency detector (PFD), a charge pump-based loop filter, a state machine, and a voltage controlled oscillator (VCO) with a plurality of operating curves. An error signal is generated by the phase/frequency detector (PFD) based on comparing an input signal and a PLL feedback signal. A filtered voltage corresponding to the error signals is generated by the charge pump-based loop filter. A state condition is determined based on comparing the input signal and the PLL feedback signal by the state machine.

The voltage controlled oscillator (VCO) comprises a current cell, a voltage-to-current converter (V2C), and a current-controlled oscillator (CCO). One of the operating curves is selected according to the state condition and a first current is generated accordingly by the current cell. The voltage-to-current converter (V2C) selects an operating point on a selected operating curve and converts the filtered voltage to a second current. An oscillating signal is generated by the current-controlled oscillator (CCO) according to the operating point, and is used to generate the PLL feedback signal.

Another object of the present invention is to provide a method for implementing a multi-transfer curve in a phase lock loop. The method comprises the following steps.

In an initial mode, a current operating curve based on comparing an input signal and a PLL feedback signal is determined, a default current to select a default operating point on the current operating curve is provided, and an oscillating signal according to the default operating point is output. When the comparison of the input signal and the PLL feedback signal meets a predetermined requirement, the procedure switches to a normal mode.

In normal mode, a filtered current based on comparing the input signal and the PLL feedback signal is generated, an operating point on the current operating curve according to the filtered current is selected, and the oscillating signal according the operating point is output.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

A detailed description of an embodiment of the present invention is provided in the following.

Figure 1:
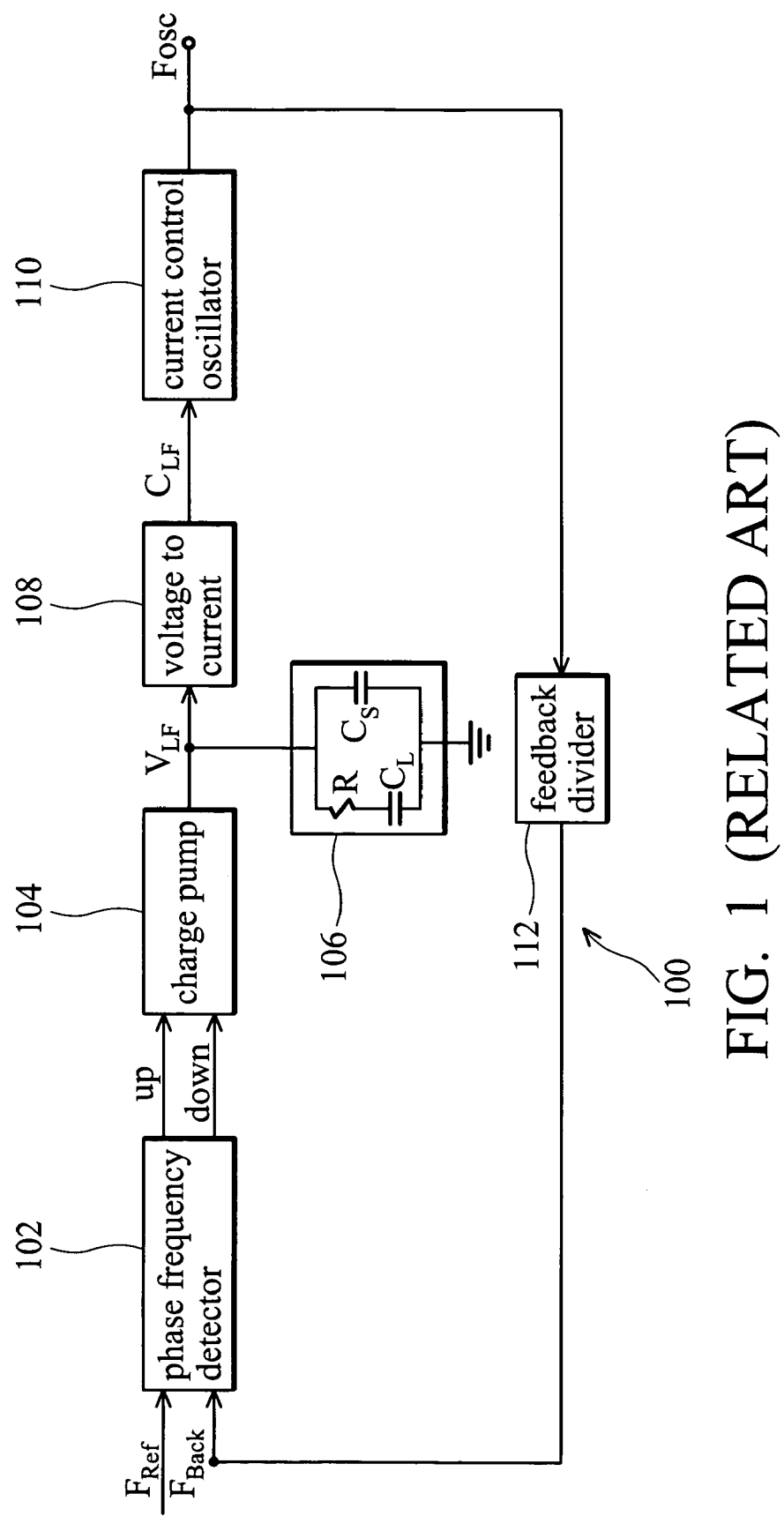
FIG. 1 is a block diagram of PLL according to the related art.
Figure 2:
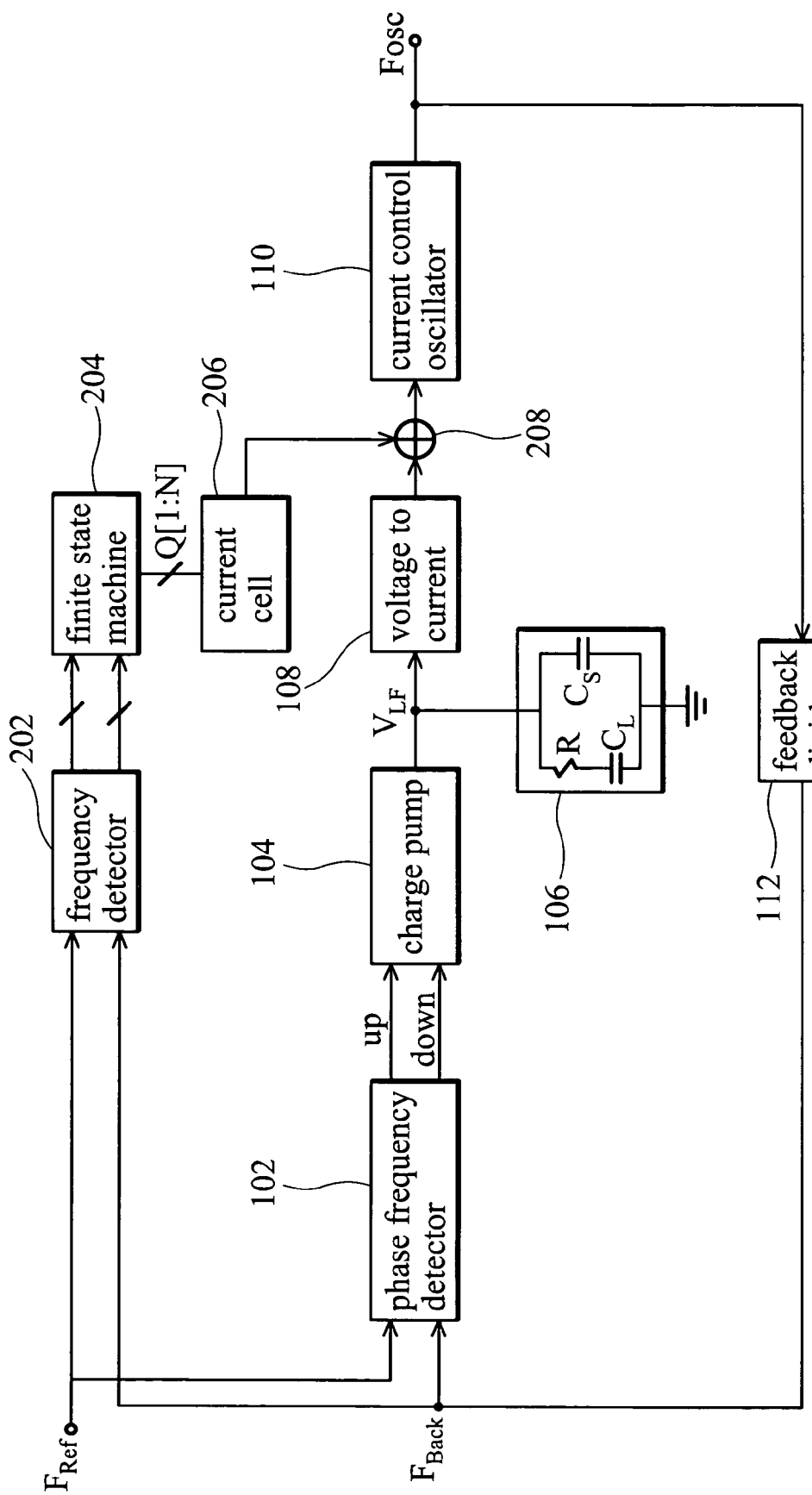
FIG. 2 is a block diagram of PLL according to the present invention.

FIG. 2 shows a block diagram of a charge bump-based phase-lock loop 200, according to one embodiment of the present invention. In PLL 200, phase frequency detector (PFD) 102, charge pump 104, loop filter 106, voltage to current (V2C) 108, current control oscillator (CCO) 110 and feedback divider 112 are analogous to the corresponding components of PLL 100 of FIG. 1. In addition, PLL 200 comprises frequency detector 202, state machine 204, current cell 206 and current adder 208. These components are designed to enable PLL 200 to automatically select an appropriate operating curve whenever the PLL 200 is powered on.

In FIG. 2, the frequency detector 202 detects the frequency difference of the reference signal $F_{Ref}$ and the feedback signal $F_{Back}$, and the state machine 204 determines whether a condition state is appropriate. The state machine delivers digital values N (the value of N depends on implementation) for the current cell 206 to select an appropriate operating curve and output a current accordingly.

The PLL 200 operates in two modes, initial mode, and normal mode. The major heuristic is, the state machine 204 determines which operating curve to use by applying a digitized value to the current cell 206, the V2C 108 determines which operating point on the operating curve to use by converting the input voltage $V_{LF}$ to a current $I_{LF}$, and the total current (output current of the current cell 206 and $I_{LF}$) allows the CCO 110 to function on the operating curve.

Figure 3:
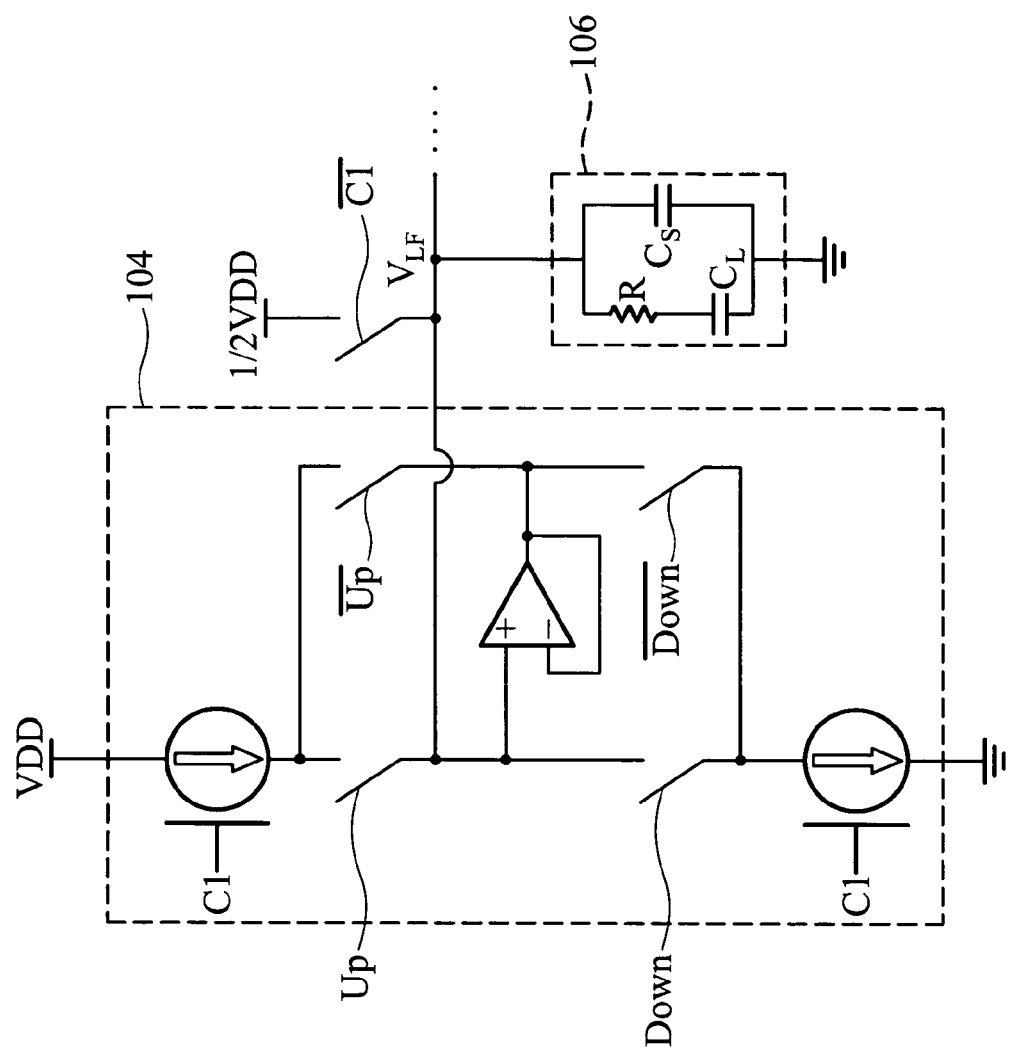
FIG. 3 is a detailed diagram for charge pump-based filter loop in FIG. 2.

During the initial mode, the charge pump 104 is off, and a default voltage is applied to VLF, for example, 1/2 VDD, as shown in FIG. 3. The state machine generates a sequence of digital control input values N that are input to current cell 206 to sequentially select different current operating curves. The V2C 108 converts the voltage $V_{LF}$ to a current $I_{LF}$. The current $I_{LF}$ and currents from the current cell are added by the current adder 208 and applied to the CCO 110 for determining a most appropriate current operating curve. For each current operating curve, with reference voltage $V_{Ref}$ applied, CCO 110 generates an output signal $F_{osc}$ having a constant frequency, and through feedback, the most appropriate current operating curve will eventually be determined and fixed, such that the normal mode is entered.

In normal mode, the current cell 206 operates on the most appropriate operating curve determined in initial mode, the predetermined voltage 1/2 VDD is turned off, and the charge pump 104 is turned on to fine tune the most appropriate operating point on the operating curve. In FIG. 2, by comparing $F_{Ref}$ and $F_{Back}$ in the PFD 102, an up signal or a down signal is applied to the charge pump 104, so as to obtain a filtered voltage VLF. The V2C 108 converts the voltage $V_{LF}$ to a current $I_{LF}$. The current $I_{LF}$ and currents from the current cell are added by the current adder 208 and applied to the CCO 110 for generating an oscillating signal $F_{osc}$. In normal mode, when fine tuning, the VLF may exceed the range from 0 to VDD if the operating curve is inappropriately selected. When this happens, the mode switches back to initial mode, and another operating curve will be reselected, such that the oscillating signal will eventually converge at the wanted frequency, as shown in FIG. 4b.

FIG. 3 shows a detailed block diagram of the charge pump-based loop filter. In initial mode, the current source is disabled by a switch C1, no current is output from the charge pump and the voltage $V_{LF}$ is predetermined at 1/2 VDD. In another embodiment of the invention, the voltage VLF can be carefully determined to be another fixed value, depending on the implementation of state machine 204 (in FIG. 2). When in normal mode, the switch C1 is turned on to enable the current source, and the predetermined voltage 1/2 VDD is simultaneously disabled. The charge pump 104 is enabled, and outputs the voltage $V_{LF}$ corresponding to the up signal and down signal generated from PFD 102.

Figure 4A:
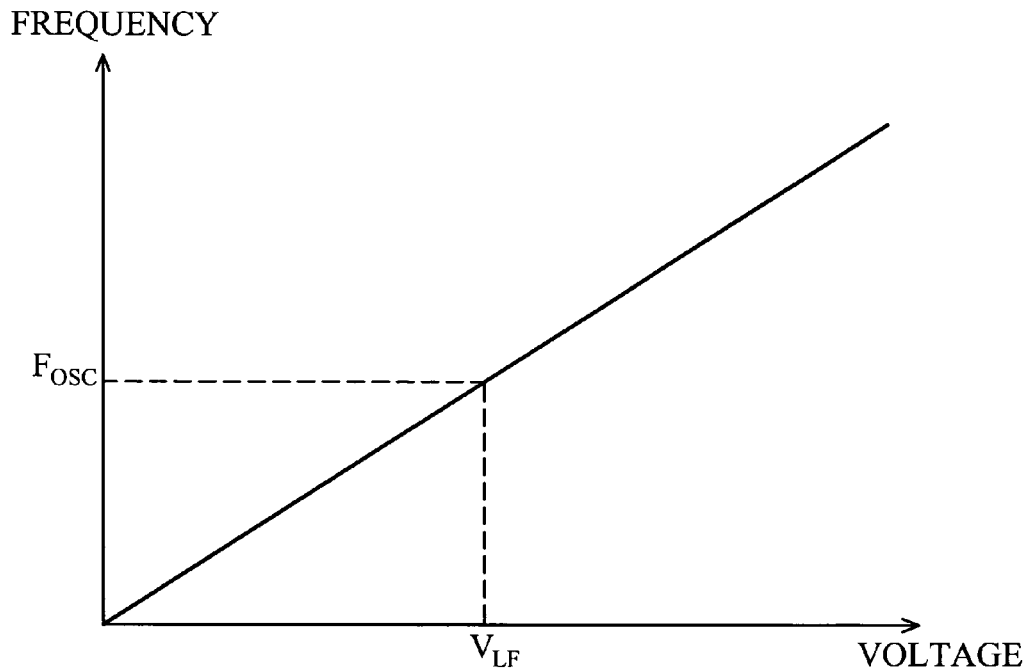
FIG. 4a shows a transfer curve according to the related art.
Figure 4B:
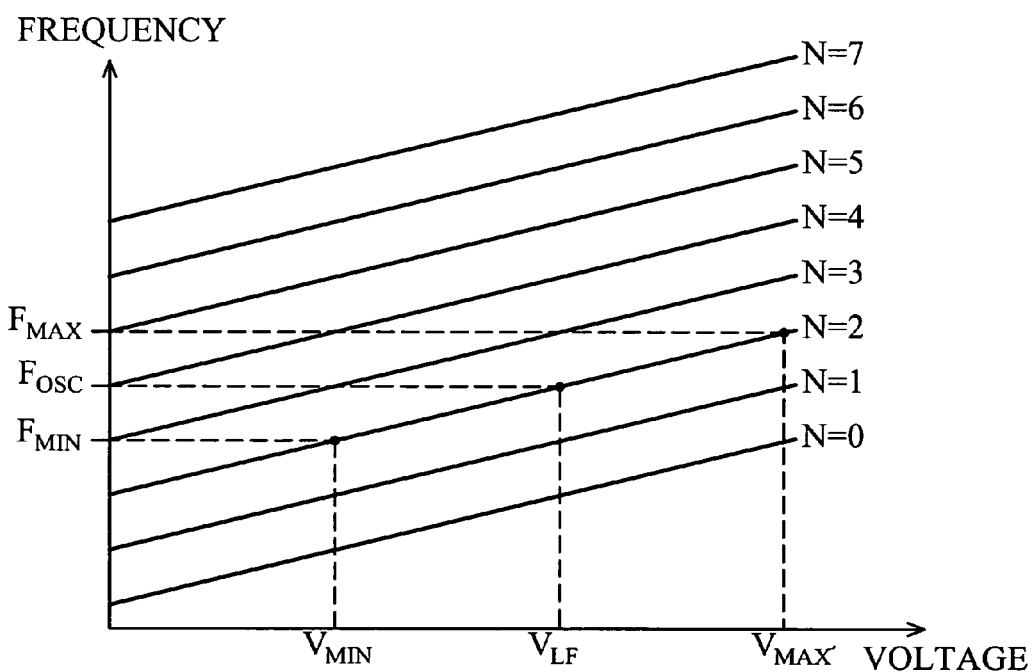
FIG. 4b shows a plurality of transfer curves according to the present invention.

FIG. 4b shows a plurality of operating curves of the PLL 200. In one embodiment, an appropriate operating curve (N=2) is first selected in initial mode through cooperation of state machine 204 and current cell 206. The process is then switched to normal mode, and through feedback, VLF (which is default to 1/2 VDD) is shifted causing the operating point to induce the wanted frequency $F_{osc}$.

Embodiments of the present invention provide advantages over the PLLs of the related art. Since the current operating curve is automatically fixed to the appropriate curve during power up, there is no need to tune the current cell in the factory. Additionally there is no need to keep an inventory of different current cell for different applications, since each current cell will be automatically leveled to the appropriate operating curve for the particular application. In addition, since the current cell is not permanently burned, the PLL can be used and then re-used for different applications. Each time the PLL is powered up, the current cell will be auto leveled to the appropriate operating curve, and can be repeated whenever needed, such as reset.

Another advantage of the present invention is that very few additional components need to be added to the conventional design of PLL 100 of FIG. 1 to achieve the auto-calibrating PLL of the present invention. Although timers and state machines may not already be present in conventional PLLs, because they are low-speed logic, the added cost is negligible compared to the savings.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit having a phase-lock loop (PLL) comprising:
   a phase/frequency detector (PFD) for generating error signals based on comparing an input signal and a PLL feedback signal;
   a charge pump-based loop filter for generating a filtered voltage corresponding to the error signals;
   a state machine capable of determining a state condition based on comparing the input signal and the PLL feedback signal; and
   a voltage controlled oscillator (VCO) with a plurality of operating curves, comprising:
   a current cell for selecting one of the operating curves according to the state condition and generating a first current accordingly;
   a voltage-to-current converter (V2C) for selecting an operating point on a selected operating curve and converting the filtered voltage to a second current; and
   a current-controlled oscillator (CCO) for generating an oscillating signal according the operating point;

wherein the oscillating signal is used to generate the PLL feedback signal.

2. The integrated circuit as claimed in claim 1, wherein:
when in an initial mode, the charge pump-based loop filter is off, and a predetermined voltage is applied to the input of V2C to generate the second current; and
when in a normal mode, the charge pump-based loop filter is on, and the filtered voltage is applied to the input of V2C to generate the second current.

3. The integrated circuit as claimed in claim 2, wherein:
when in the initial mode, the state machine determines a state condition based on comparing the input signal and the PLL feedback signal;
when in the normal mode, the state machine is fixed at the determined state condition; and
the current cell selects one of the operating curves according to the state condition and generates the first current.

4. The integrated circuit as claimed in claim 3, wherein the PLL further comprises a frequency detector for comparing the input signal and the PLL feedback signal, and outputting a result to the state machine to determine the state condition.

5. The integrated circuit as claimed in claim 3, wherein the PLL further comprises a feedback divider for receiving the oscillating signal and generating the PLL feedback signal.

6. The integrated circuit as claimed in claim 3, wherein the PLL further comprises a current adder for integrating the first current and the second current for the CCO to generate the oscillating signal accordingly.

7. A method for implementing a multi-transfer curve in a phase lock loop, comprising the following steps:
in an initial mode:
determining a current operating curve based on comparing an input signal and a PLL feedback signal;
providing a default current to select a default operating point on the current operating curve; and
outputting an oscillating signal according to the default operating point;
wherein when the comparison of the input signal and the PLL feedback signal meets a predetermined requirement, switching to a normal mode; and
in the normal mode:
generating a filtered current based on comparing the input signal and the PLL feedback signals;
selecting an operating point on the current operating curve according to the filtered current; and
outputting the oscillating signal according the operating point;
wherein the oscillating signal is used to generate the PLL feedback signal.

8. The method as claimed in claim 7, wherein the determining step in the initial mode comprises:
generating an error signal based on comparing the input signal and the PLL feedback signal;
outputting a first current according to the error signal.

9. The method as claimed in claim 8, wherein the providing step in the initial mode comprises:
generating a default voltage;
converting the default voltage to the default current.

10. The method as claimed in claim 9, wherein the output step in the initial mode comprises:
selecting the current operating curve according to the first current; and
selecting the default operating point on the current operating curve according to the default current; and
outputting the oscillating signal according to the default operating point.

11. The method as claimed in claim 7, wherein the generating step in the normal mode comprises:
generating a filtered voltage corresponding to an error signal; and
converting the filtered voltage to the filtered current.

* * * * *